(12) United States Patent
Andrews

(10) Patent No.: US 10,295,124 B2
(45) Date of Patent: May 21, 2019

(54) LIGHT EMITTER PACKAGES AND METHODS

(71) Applicant: Cree, Inc., Durham, NC (US)

(72) Inventor: Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 184 days.

(21) Appl. No.: 13/779,146

(22) Filed: Feb. 27, 2013

(65) Prior Publication Data

US 2014/0239316 A1  Aug. 28, 2014

(51) Int. Cl.
*H01L 33/60* (2010.01)
*F21K 9/233* (2016.01)

(52) U.S. Cl.
CPC .... *F21K 9/233* (2016.08); *H05K 2201/10106* (2013.01)

(58) Field of Classification Search
CPC ......... H01L 33/60; H01L 33/44; H01L 33/46; H01L 33/56; H01L 33/52; H01L 33/54; F21K 9/137; H05K 2201/10106; H05K 1/0274; H05K 2203/1394; H05K 2203/063; H05K 2201/09063; H05K 2201/2054; H05K 3/281; G02F 1/133603
USPC .......................................................... 257/98
See application file for complete search history.

(56) References Cited

U.S. PATENT DOCUMENTS

| 4,946,547 A | 8/1990 | Palmour |
|---|---|---|
| 5,200,022 A | 4/1993 | Kong |
| RE34,861 E | 2/1995 | Davis |
| 7,213,940 B1 | 5/2007 | Van de Ven |
| 7,791,061 B2 | 9/2010 | Edmond |
| 8,058,088 B2 | 11/2011 | Cannon |
| 2004/0227144 A1* | 11/2004 | Hon ................................. 257/87 |
| 2007/0158668 A1 | 7/2007 | Tarsa |
| 2007/0228402 A1* | 10/2007 | Leong et al. .................... 257/98 |
| 2007/0252161 A1* | 11/2007 | Meis et al. ....................... 257/88 |
| 2008/0054279 A1* | 3/2008 | Hussell et al. ................... 257/95 |
| 2008/0170396 A1* | 7/2008 | Yuan et al. .................... 362/244 |

(Continued)

FOREIGN PATENT DOCUMENTS

| JP | 2006-186297 | 7/2006 |
|---|---|---|
| KR | 10-2007-0087338 | 8/2007 |
| TW | 201436299 | 9/2014 |

OTHER PUBLICATIONS

International Search Report for Application No. PCT/US2014/016898 dated Jun. 8, 2014.

*Primary Examiner* — Mohammed R Alam
(74) *Attorney, Agent, or Firm* — Jenkins, Wilson, Taylor & Hunt, P.A.

(57) ABSTRACT

Light emitter packages and related methods having improved performance are disclosed. In one aspect, a light emitter package can include at least one light emitter chip disposed over a substrate or submount. In some aspects, the package can include a reflective polymeric material or polymeric reflector (sometimes referred to as a "solder mask" or "solder mask material"), a reflective material, and a conductive material disposed adjacent each other within a portion of the light emitter package. In some aspects, the reflective material can include a metallic material or metallic reflector applied to side walls of traces and/or within portions of a gap between traces prior to application of the reflective polymeric material within the gap.

49 Claims, 6 Drawing Sheets

(56) References Cited

U.S. PATENT DOCUMENTS

| | | |
|---|---|---|
| 2008/0173884 A1 | 7/2008 | Chitnis |
| 2008/0179611 A1 | 7/2008 | Chitnis |
| 2008/0258130 A1 | 10/2008 | Bergmann |
| 2008/0308834 A1* | 12/2008 | Chu et al. .................. 257/99 |
| 2009/0121241 A1* | 5/2009 | Keller et al. ............... 257/96 |
| 2009/0121249 A1* | 5/2009 | Tseng et al. ............... 257/98 |
| 2009/0146155 A1 | 6/2009 | Wang et al. |
| 2010/0155763 A1 | 6/2010 | Donofrio |
| 2010/0176705 A1* | 7/2010 | Van Herpen ...... B32B 17/10036 313/46 |
| 2010/0193816 A1* | 8/2010 | Liu ............................. 257/98 |
| 2010/0193822 A1* | 8/2010 | Inobe .................... H01L 33/56 257/98 |
| 2010/0252851 A1 | 10/2010 | Emerson et al. |
| 2011/0073889 A1* | 3/2011 | Sugizaki et al. ........... 257/98 |
| 2011/0089455 A1* | 4/2011 | Diana et al. ............... 257/98 |
| 2011/0186873 A1* | 8/2011 | Emerson ..................... 257/88 |
| 2011/0222267 A1* | 9/2011 | Park et al. ................. 362/97.1 |
| 2011/0248287 A1* | 10/2011 | Yuan et al. ................. 257/88 |
| 2011/0284887 A1* | 11/2011 | Wu et al. ................... 257/91 |
| 2012/0049230 A1* | 3/2012 | Jeong ......................... 257/98 |
| 2012/0061706 A1* | 3/2012 | Kamada ..................... 257/98 |
| 2012/0112215 A1* | 5/2012 | Chai et al. ................. 257/89 |
| 2012/0112238 A1* | 5/2012 | Mirsky et al. ............. 257/99 |
| 2012/0153327 A1* | 6/2012 | Kim et al. .................. 257/98 |
| 2012/0205689 A1 | 8/2012 | Welch et al. |
| 2012/0326188 A1* | 12/2012 | Han ...................... H01L 33/60 257/98 |
| 2013/0037842 A1* | 2/2013 | Yamada et al. ............ 257/98 |

\* cited by examiner

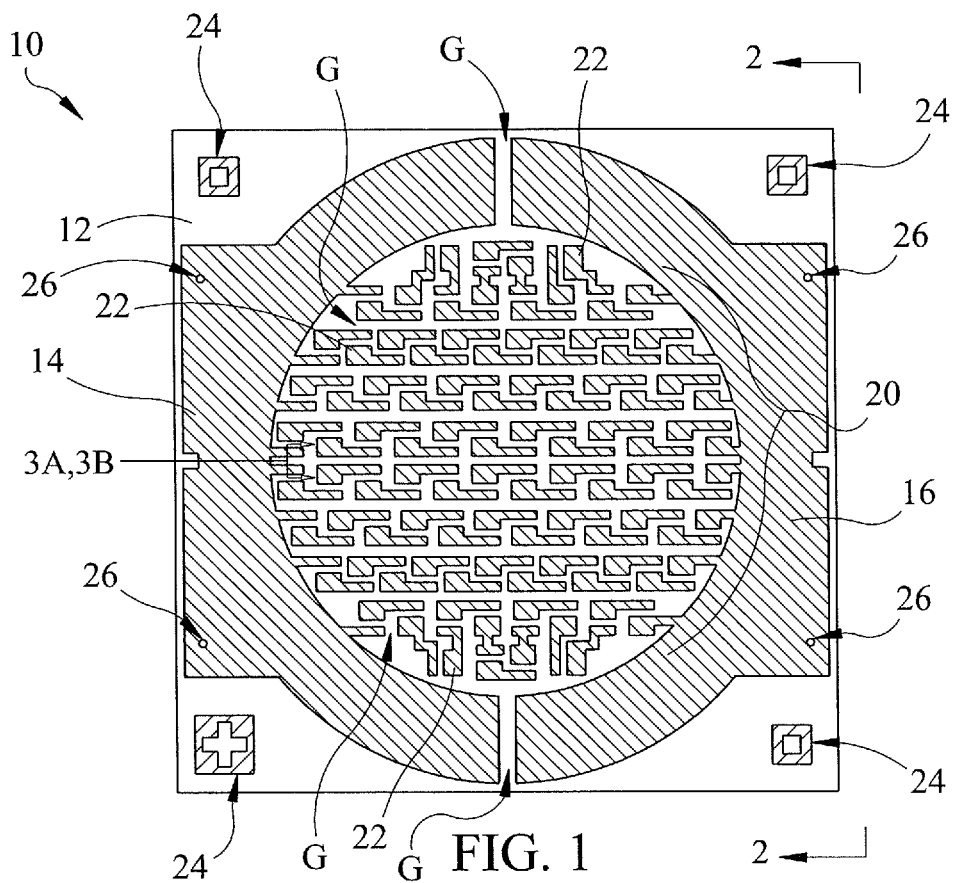
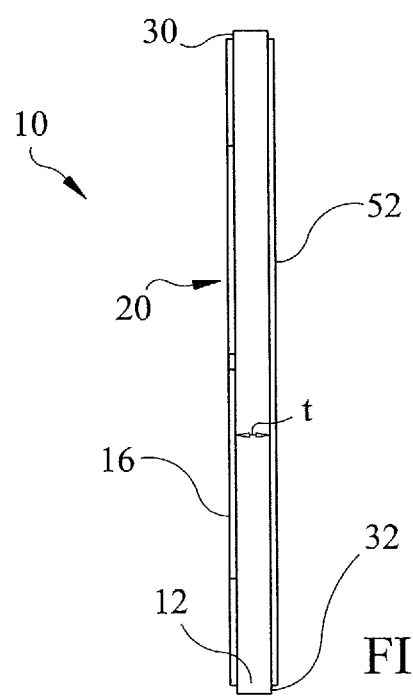

LIGHT EMITTER PACKAGES AND METHODS

TECHNICAL FIELD

The subject matter disclosed herein relates generally to light emitter packages and related methods. More particularly, the subject matter disclosed herein relates to ceramic based light emitting diode (LED) packages having improved light reflection and/or improved light extraction, and related methods.

BACKGROUND

Light emitters, such as light emitting diodes (LEDs) or LED chips are solid state devices that convert electrical energy into light. LED chips can be utilized in light emitter packages for providing different colors and patterns of light useful in various lighting and optoelectronic applications. For example, light emitter packages can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Brighter, more efficient LED chips and/or packages can allow lighting manufacturers to use fewer LED chips to get the same brightness at a lower cost and/or increase brightness levels using the same LED chip count and power. Such improvements can enable delivery of improved light emitter packages and/or systems for less total cost than other solutions.

One problem associated with conventional light emitter packages incorporating light emitters is that in multi-chip packages light becomes trapped within gaps between LED chips and/or absorbed by side walls adjacent gaps between LED chips. One solution to this problem includes applying a blanket coating of a white solder mask material within the gaps to increase reflection. However, light passing into and/or through portions of the solder mask material can still be absorbed or trapped within gap areas of the package. As such, this solution falls short of achieving a desired increase in package brightness.

Thus, despite the availability of various light emitter packages in the marketplace, a need remains for brighter, more cost-effective light emitter packages and/or methods which consume the same and/or less power and are more reflective as compared to conventional packages. Such packages and methods can also make it easier for end-users to justify switching to LED products from a return on investment or payback perspective.

SUMMARY

In accordance with this disclosure, light emitter packages, systems, and methods are disclosed herein and have improved performance. For example, packages, systems, and methods described herein can advantageously exhibit improved reflection, improved brightness, improved light extraction, and/or ease of manufacture. In some aspects, an improved, brighter light emitter package can be provided. The improved package can comprise at least one light emitter chip disposed over a submount. In some aspects, the package can further comprise a first reflective layer covered with a second reflective layer.

In some aspects, the first reflective layer comprises a metallic layer and/or a specularly reflective layer. In some aspects, the second reflective layer can comprise a white material or white layer, a silver material or silver layer, a reflective plastic material or layer, a Lambertian coating, a diffusively reflective coating, a reflective polymeric material, or any other reflective coating adapted to cover the first reflective layer.

In some aspects, the first and second reflective layers are disposed over a non-reflective light blocking structure, structure, or coating. The light-blocking structure can comprise any non-reflective material or structure. In some aspects, the light blocking structure comprises a conductive material or layer, such as a layer of copper (Cu).

In some aspects, light emitted by the light emitter chip can penetrate through a portion of the second reflective layer and can be further reflected from the underlying first reflective layer. In some aspects, the light blocking surface is covered with another reflective coating.

In some aspects, an improved, brighter light emitter package can be provided and include at least one light emitter chip disposed over a submount. In some aspects a reflective material, a reflective coating over the reflective material, and a conductive material can be disposed adjacent to each other within a portion of the light emitter package. In some aspects, the reflective material can include a specularly reflective metallic reflector or metallic layer. In some aspects, the reflective coating over the reflective material can include a plastic coating, a Lambertian coating, or a coating of solder mask.

In some aspects, light can enter the reflective coating, such as the solder mask material, and be reflected back out through the solder mask material via the underlying reflective material. In some aspects, the reflective material can comprise electroless silver.

In some aspects, a brighter, more efficient light emitter package can be provided. The light emitter package can comprise a first trace and a second trace. In some aspects, a gap or trench can be disposed between the first and second traces. At least one light emitter chip adapted to electrically communicate with portions of the first and second traces. In some aspects, first and second side walls of the first and second traces, respectively, oppose each other across the gap, and the first and second side walls can be coated with a reflective material.

In some aspects, a reflective polymeric material (sometimes referred to as a "solder mask" or "solder mask material") can be provided in portions of the gap and/or applied adjacent to the side walls of the first and second traces after application of the reflective material. In some aspects, the reflective material can comprise electroless silver adapted to reflect light which permeates the solder mask.

In some aspects, a method of producing a light emitter package is disclosed. The method can comprise providing a substrate or submount, providing multiple light emitter chips over the substrate, and plating a portion of the substrate with a copper (Cu) trace. The method can further comprise treating a surface of the Cu trace, for example, via burnishing or polishing the surface of the trace. The method can further comprise depositing a layer of electroless Ag on the surface of the treated Cu and adding a solder mask. Notably, the electroless Ag can comprise a reflective material that is applied to portions of the light emitter device before addition of the solder mask. The reflective material disposed adjacent portions of the solder mask can advantageously increase the amount of light reflected from the light emitter package. In addition to the above aspects, it is an object of the present disclosure to improve brightness of the light emitter package without having to add more emitter chips or increasing power.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 1 is a top plan view of a portion of a light emitter package according to one aspect of the disclosure herein;

FIG. 2 is a side view of a light emitter package according to one aspect of the disclosure herein;

DETAILED DESCRIPTION

Figure 3A:
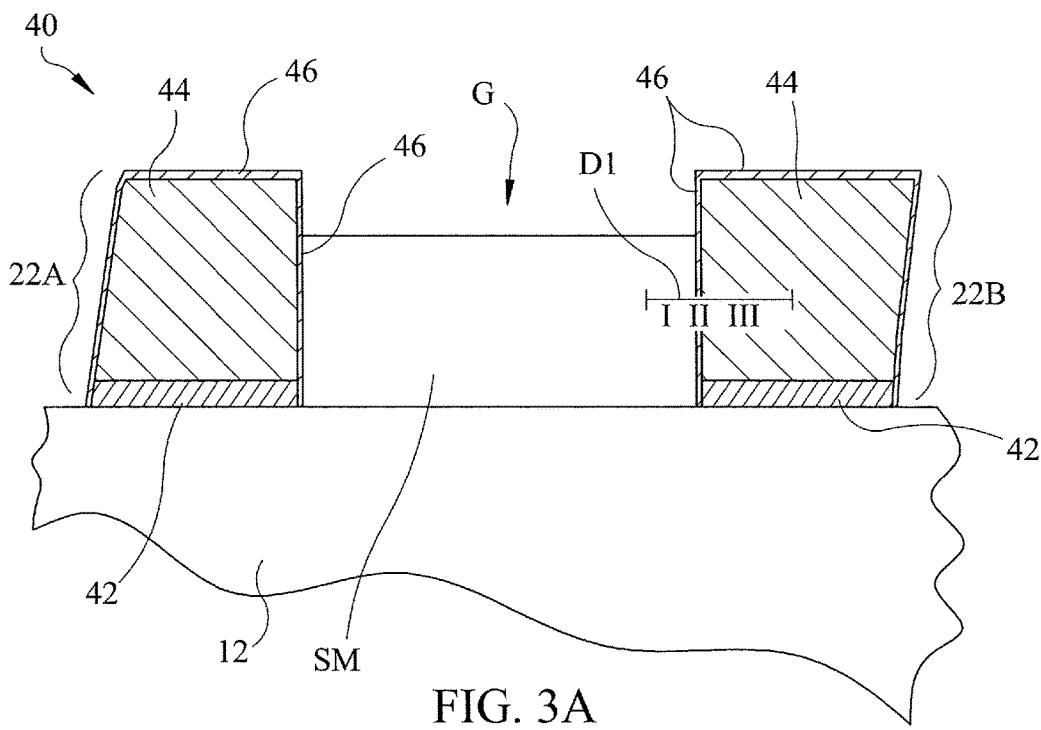
FIGS. 3A and 3B are sectional views of a light emitter package according to aspects of the disclosure herein.

The subject matter disclosed herein is directed to packages and methods for use with light emitters, such as light emitting diodes (LEDs) or LED chips. Packages, and methods described herein are adapted to exhibit improved performance, for example, improved efficiency, brightness, light extraction, and/or thermal management. In some aspects, each of these improvements contributes to and/or can be provided at a lower cost than conventional packages.

As used herein, the terms "solder mask" and/or "solder mask material" refer to a reflective polymeric material for increased brightness and/or corrosion protection.

Packages described herein can utilize one or more novel reflective materials or coatings that can for example be applied prior to application of a second reflective coating, such as a solder mask. In some aspects, the one or more novel reflective materials or coatings can be adapted to reflect light that permeates through the solder mask in, for example, a gap or trench disposed between adjacent traces. In some aspects, side walls of opposing traces as well as a floor of the gap between traces can be coated with a reflective material or layer to improve reflection and thereby improve light extraction without having to add more LED chips.

In some aspects, light can enter the solder mask material and become reflected back out through the solder mask material via the reflective material. In some aspects, the reflective material can comprise electroless silver (Ag).

In some aspects, a solder mask material can be provided in portions of one or more gaps and/or applied adjacent to the side walls of adjacent traces after application of the reflective material. In some aspects, the reflective material can comprise electroless Ag adapted to reflect light which permeates the solder mask.

In some aspects, a method of producing a light emitter package is disclosed. The method can comprise providing a substrate or submount, providing multiple light emitter chips over the substrate, and plating a portion of the substrate with a copper (Cu) trace. The method can further comprise treating a surface of the Cu trace, for example, via burnishing or polishing the surface of the trace. The method can further comprise depositing a layer of electroless Ag on the surface of the treated Cu and adding a solder mask. Notably, the electroless Ag can comprise a reflective material that is applied to portions of the light emitter device before addition of the solder mask. The reflective material disposed adjacent portions of the solder mask can advantageously increase the amount of light reflected from the light emitter package. It is an object of the present disclosure to improve brightness of the light emitter package without having to add more emitter chips or increasing power.

In some aspects, packages and methods described herein can comprise and/or include providing a first reflective layer covered with a second reflective layer. In some aspects, the first reflective layer comprises a metallic layer and/or a specularly reflective layer. In some aspects, the second reflective layer can comprise a white material or white layer, a silver material or silver layer, a reflective plastic material or layer, a Lambertian coating, or any other reflective coating adapted to cover the first reflective layer.

In some aspects, the first and second reflective layers are disposed over a non-reflective light blocking structure, structure, or coating. The light-blocking structure can comprise any non-reflective material or structure. In some aspects, the light blocking structure comprises a conductive material or layer, such as a layer of copper (Cu).

In some aspects, light emitted by the light emitter chip can penetrate through a portion of the second reflective layer and can be further reflected from the underlying first reflective layer. In some aspects, the light blocking surface is covered with another reflective coating.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride (AlN), aluminum oxide ($Al_2O_3$), beryllium oxide (BeO), silicon carbide (SiC)). A "non-ceramic based material" consists primarily a metallic material, a primarily organic (e.g., polymeric) material, and/or a primarily synthetic or semi-synthetic organic solid that can be dispensed or molded (e.g., plastic).

As used herein, the terms "specular" reflection and/or being "specularly" reflective describes a mirror-like reflection of light from a surface, in which light from a single incoming direction is reflected into a single outgoing direction.

As used herein, the terms "diffuse" reflection and/or being "diffusively" reflective describes reflection of light from a surface such that an incident ray is reflected at a plurality of angles rather than at just one angle as in the case of specular reflection.

Light emitter packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. Nos. 4,946,547, and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa1-xN$ where 1>x>0 are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more solid state light emitters such as LED chips, and notably, portions of light emitter packages described herein such as portions of the ceramic based submount, lens, and/or traces can be at least partially coated with one or more phosphors. The phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat.

No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

FIGS. 1 to 7B are embodiments of packages and methods for use with light emitters, such as LED chips. Light emitter packages and systems described herein can advantageously be configured for improved performance, such as improved brightness and/or reflection while delivering more LPW at an improved, lower cost than conventional packages and systems.

FIG. 1 illustrates a light emitter package generally designated 10. Light emitter package 10 can comprise a substrate or submount 12 which can support multiple solid state light emitters, such as multiple LED chips (74, FIG. 5). Submount 12 can comprise any suitable material, for example, an electrically insulating (e.g. substantially non-electrically conductive) material with a low thermal resistance and/or high thermal conductivity. In one aspect, submount 12 can for example comprise a non-metallic material, such as a ceramic or ceramic based material. For example, submount 12 can comprise aluminum oxide or alumina ($Al_2O_3$) and derivatives thereof, aluminum nitride (AlN) and derivatives thereof, silicon carbide (SiC) and derivatives thereof, zirconium dioxide or zirconia ($ZrO_2$) and derivatives thereof, titanium dioxide ($TiO_2$) and derivatives thereof, combinations thereof, and/or any other ceramic based or ceramic containing material. In one aspect, submount 12 can comprise AlN and/or $Al_2O_3$ which can advantageously comprise a low thermal resistance. Material(s) having a low thermal resistance may be advantageous when provided as submount 12, as heat can more readily dissipate from LED chips (74, FIG. 5) and allow light emitter packages disclosed herein to run cooler at steady state, thereby increasing lumen output.

In some aspects, submount 12 can comprise a material having a thermal conductivity of approximately 30 watts per meter kelvin (W/m·K) or more (e.g., zinc oxide (ZnO)). Other acceptable materials have thermal conductivities of approximately 120 W/m·K or more, (e.g., AlN which has a thermal conductivity that can range from approximately 140 to approximately 180 W/m·K). In terms of thermal resistance, some acceptable materials have a thermal resistance of approximately 2° C./W or lower. Other materials may also be used that have thermal characteristics outside the ranges discussed herein.

In some aspects, one or more areas or portions of electrically conductive material can be disposed over one or more portions of submount 12. For example, a first electrically conductive trace 14 and a second electrically conductive trace 16 can be provided over portions of submount 12. First and second traces 14 and 16, respectively, can be physically and/or electrically separated by one or more gaps or trenches, generally designated G. In some aspects, a plurality of solid state light emitters or LED chips (74, FIG. 5) can electrically communicate directly (e.g., via direct die attach) and/or indirectly (e.g., via wirebonds) with portions of each of first and second traces 14 and 16. First and second traces 14 and 16, respectively, can comprise first and second electrical terminals, or electrical contacts, of package 10. That is, in some aspects, first and second traces 14 and 16 are referred to as the anode and cathode, respectively, of package 10.

In some aspects, one or more areas or portions of electrically conductive material can be deposited between portions of first trace 14 and second trace 16. For example and in some aspects, a plurality of traces, generally designated 20 can be disposed between first trace 14 and second trace 16. The plurality of traces 20 can comprise more than one individual trace 22 separated by one or more gaps G. In some aspects, each individual trace 22 can be adapted to attach to a portion of at least one LED chip (e.g., 74, FIG. 5). In some aspects, some individual traces 22 can extend from portions of first trace 14 and some individual traces 22 can extend from portions of second trace 16. Some individual traces can also not be attached to portions of either first trace 14 or second trace 16. As described below, each individual trace 22 and first and second traces 14 and 16, respectively, can comprise one or more layers of titanium (Ti), copper (Cu), and/or silver (Ag). In some aspects, one or more optional layers of electroless nickel immersion gold (ENIG) can also be applied over portions of traces for improving the wirebondability of light emitters, such as LED chips, to the trace layers of material.

In some aspects, first and second traces 14 and 16 can, but do not have to, be the same material or materials as the plurality of traces 20. In some aspects, first and second traces 14 and 16, respectively, and the plurality of traces 20 can be provided over submount 12 via chemical deposition, physical deposition, chemical vapor deposition, plasma deposition, electrolysis, electroplating and/or electroless plating techniques. In one aspect, any suitable processing technique can be used for coating non-metallic parts (e.g., submount 12) with electrically conductive material. In some aspects, first and second traces 14 and 16, and the plurality of traces 20, comprised of electroless metals deposited via electroless processes, may be desired as such techniques can advantageously produce traces having more uniform thicknesses as compared to other methods. Any method of layering, coating, and/or depositing conductive material over submount 12 for providing first and second traces 14 and 16, respectively, as well as the plurality of traces 20 is contemplated.

In some aspects, one or more gaps G can be disposed between adjacent individual traces 22 within the plurality of traces 20. Package 10 can comprise a multi-trace device adapted to receive multiple LED chips. In some aspects, gaps G can be disposed between portions of first trace 14 and the plurality of traces 20. In some aspects, gaps G can also be disposed between portions of second trace 16 and the plurality of traces 20. In some aspects, first and second traces 14 and 16 can be peripherally disposed about the plurality of traces 20. That is, in some aspects the plurality of traces 20 can be centrally disposed over submount 12 and surrounded by portions of first and second traces 14 and 16. In some aspects, the plurality of traces 20 can comprise a substantially circular shaped area which is substantially centrally disposed over submount 12. In some aspects, first and second traces 14 and 16 can comprise substantially C-shaped and/or curved portions of material which can curve about the circular shaped plurality of traces 20. Placing a plurality of LED chips (74, FIG. 5) over the plurality of centrally disposed traces can improve thermal management within package 10, as heat generated by a plurality of centrally disposed LED chips can dissipate more readily from the center to the edges of the package submount 12. In addition, heat can spread away from the center of the package 10.

Figure 5:
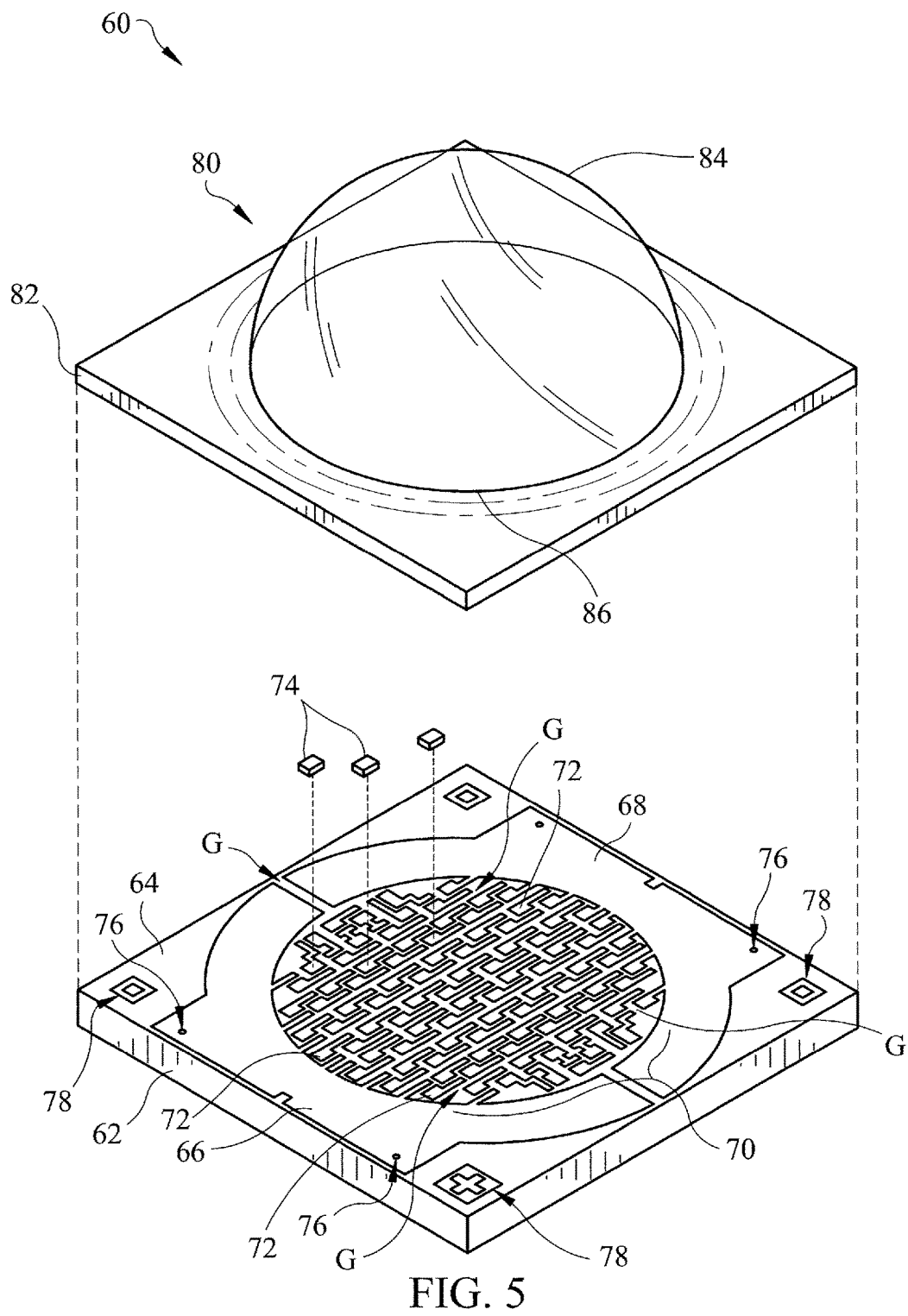
FIG. 5 is an exploded view of a light emitter package according to one aspect of the disclosure herein.

In some aspects, some individual traces 22 can comprise a square and/or rectangular shaped portion adapted to attach and/or electrically communicate with a light emitter, such as an LED chip (74, FIG. 5). For example, at least one light emitter can be disposed over each square or rectangular shaped portion and can directly attach and directly electrically communicate with the individual trace 22 via an electrically conductive paste, solder material, adhesive, flux material, or epoxy. In other aspects, at least one light emitter can be attached to a portion of an individual trace 22 via silicone or other non-electrically conductive material and the light emitter can electrically communicate to the individual trace 22 via an electrical connector, such as a wire or wirebond.

In some aspects, one or more leg portions can extend from the rectangular or square shaped portions of some individual traces 22. The leg portions can be smaller in width and/or thinner than the rectangular or square shaped portions of some individual traces 22. In some aspects, electrical signal or current can pass into a plurality of light emitters disposed over individual traces 22 and/or can pass between first and second traces 14 and 16, in part, by wirebonding light emitters to leg portions of individual traces 22. Each rectangular and/or square shaped portion of some individual traces 22 within the plurality of traces 20 can be, but do not have to be the same size. Each rectangular and/or square shaped portion of some individual traces 22 within the plurality of traces 20 can be, but do not have to be the same shape. In some aspects, a combination of rectangular and square shaped light emitters (e.g., LED chips) can be used in package 10. In some aspects, only square light emitters can be used in package 10. In certain other aspects, only rectangular shaped light emitters can be used in package 10.

Rectangular and/or square shaped portions of individual traces 22 can include any suitable size and can vary with respect to the size and/or shape of LED chip or chips used. For example and in some aspects, rectangular shaped portions of some individual traces 22 can have length and width dimensions that are at least approximately 300 μm×200 μm; at least approximately 350 μm×250 μm; at least approximately 400 μm×300 μm; or greater than approximately 500 μm×400 μm. For example and in some aspects, square shaped portions of some individual traces 22 can have length and width dimensions that are at least approximately 150 μm×150 μm; at least approximately 200 μm×200 μm; at least approximately 300 μm×300 μm; at least approximately 400 μm×400 μm; or greater than approximately 500 μm×500 μm. As noted earlier, the plurality of traces 20 can comprise a mix of square and rectangular portions of any suitable size can be provided over submount 12. In some aspects, only square or only rectangular portions of some individual traces 22 may be provided as only square or only rectangular light emitters may be provided.

In some aspects, light emitter package 10 can comprise a plurality of light emitters that are each a same size. In other aspects, light emitters of different sizes (large and small) can be used together within package 10. As such, different sizes and/or shapes of individual traces 22 within the plurality of traces 20 can be provided. In some aspects, individual traces 22 can comprise square shaped portions, rectangular shaped portions, non-square shaped portions, non-rectangular shaped portions, circular shaped portions, asymmetrically shaped portions, symmetrically shaped portions, combinations thereof, and/or any other suitably shaped and/or sized portions. Light emitters that are adapted to emit different colors of light can also be provided in package 10. For example, primarily green, cyan, blue, red, orange, amber, yellow and/or white light emitters can be provided.

Still referring to FIG. 1, and in some aspects, package 10 can further comprise one or more optional connection points generally designated 24. In some aspects, connection points 24 can comprise solder pads adapted to connect to wires (not shown) from the external power source (not shown). In some aspects, connection points 24 can comprise through holes and/or electrically conductive vias for connecting to an external power source (not shown). In some aspects, connection points 24 can comprise Ag vias and/or layers of Ti, Cu, Ag, or additional metals in the form of a solder pad deposited over portions of the initially deposited metal layer. In some aspects, connection points 24 can comprise test points, by which electrical and/or thermal properties of package 10 can be tested. At least one connection point 24 can denote the electrical polarity of first trace 14 and/or second trace 16. For example, at least one connection point 24 can comprise a "+" sign adapted to denote the electrical polarity of the closest proximate trace, such as first trace 14. Accordingly, first trace 14 can comprise an anode as denoted by the proximate "+" sign shaped connection point 24, and second trace 16 can comprise a cathode.

In some aspects, package 10 can comprise one or more optional through holes or vias, generally designated 26. Vias 26 can comprise electrically conductive portions of material which extend internally within submount 12 for allowing various portions of package to electrically and/or thermally communicate. For example, in some aspects vias 26 comprise areas of Ag, or other conductive material, which can extend substantially vertically and/or in angled configurations within portions of submount 12 to electrically connect first or second traces 14 and 16, respectively, to bottom electrical contacts. Vias 26 can comprise any suitably electrically conducting material, such as Ag, Cu, Au, Pt, or any other metal or metal alloy and can be applied using any suitable technique. As vias 26 physically and/or electrically connect respective electrical contacts (e.g., 50 and 52, FIG. 4) to respective traces (e.g., 14 and 16), it is understood that electrical contacts and/or traces may be positioned in any arrangement over portions of submount 12.

A side view of package 10 is illustrated in FIG. 2. In some aspects, package 10 can comprise a first surface 30 upon which first trace 14 and second trace 16 can be deposited. First trace 14 and second trace 16 can peripherally surround the plurality of traces 20 which can be deposited and optionally centrally disposed over portions of first surface 30. Submount 12 can comprise a second surface 32 opposite first surface 30. One or more contacts (e.g., 50 and 52, FIG. 4) can be deposited over portions of second surface 32. In some aspects, contacts can comprise one or more layers of Ti, Cu, and/or Ag similar to the plurality of electrical traces 20. Vias 26 (FIG. 4) can electrically connect first and second traces 14 and 16 to bottom contacts by extending internally through or within portions of submount 12.

In some aspects as illustrated in FIG. 2, submount 12 can comprise a thickness t upon which electrical components including traces and contacts can be deposited. Thickness t can for example range from approximately 0.1 mm to 1 mm. In some aspects, thickness t is approximately 0.5 mm. In some aspects, thickness t can comprise any sub range of thickness between approximately 0.1 mm and 1 mm, including for example, a range of approximately 0.1 to 0.4 mm; 0.4 to 0.8 mm, or 0.8 mm to 1 mm. However, any thickness is contemplated.

Notably, package 10 can comprise a plurality and/or a network of gaps G disposed and extending between portions of individual traces 22 of the plurality of traces 20, and also extending between portions of first and second traces 14 and 16. Each gap G can be bounded by lateral side walls of individual traces 22, first trace 14, and/or second traces 16. Portions of gaps G between and/or side walls of various traces or conductive portions can be treated such that each can be more reflective, thereby improving reflection and light extraction per package. In some aspects, the floors of gaps G and/or exposed surfaces of traces, including the upper surfaces and side walls of traces, can advantageously become a significant part of the overall light affecting surface area within package 10 by being treated to be more reflective. The subject matter herein is adapted, at least in part, to increase reflectivity of the plurality of gaps G and/or side walls of various traces including first and second traces 14 and 16, as well as individual traces 22 to improve package brightness. To increase the reflectivity of gaps G and side walls, a reflective material can be applied or coated within portions of gaps G, as well as over portions of first and second traces 14 and 16, and some individual traces 22 within the plurality of traces 20 such that light can be reflected therefrom. In some aspects, gaps G and side walls can be treated via application of a reflective material within portions of gaps G and over portions of trace side walls prior to application of a solder mask.

Figure 3B:
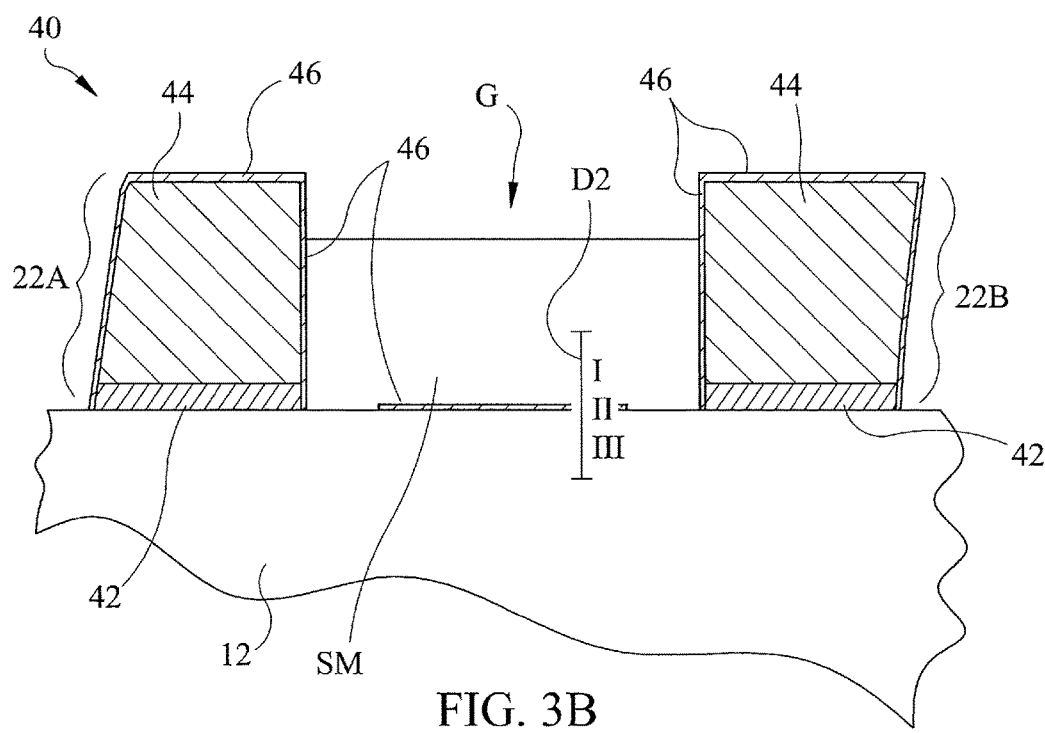

FIGS. 3A and 3B illustrate detailed sectional views of a portion of a light emitter package, generally designated 40. Portion 40 of light emitter package 10 is a sectional view along lines 3A/3B over portions of individual traces 22 in FIG. 1. As FIGS. 3A and 3B illustrate, portions 40 of package 10 can comprise one or more reflective materials that have been applied over one or more surfaces of package components prior to application of a solder mask, such that light entering through the solder mask can become reflected back out from portions of the package rather than remaining trapped between traces in one or more gaps G and/or being absorbed by traces. In some aspects, first and second adjacent traces 22A and 22B can comprise one or more layers of material deposited over portions of submount 12. At least one of these layers can comprise a reflective material deposited prior to application of a second reflective material, such as a solder mask, and the initially applied reflective material can directly touch the solder mask in some embodiments.

In some aspects, each trace, including first trace 14, second trace 16, and/or any individual trace 22 of the plurality of traces (e.g., first and second adjacent traces 22A and 22B) can comprise a first, optional adhesion layer 42 of material, a second, conductive layer 44 of material disposed over the adhesion layer 42 of material, and a third, reflective layer 46 of material disposed over the conductive layer 44 of material. In some aspects, only a conductive layer 44 and a reflective layer 46 can be deposited. In some aspects, optional adhesion layer 42 can comprise a thin layer of Ti, for example, that can be approximately 0.10 µm thick. In some aspects, adhesion layer 42 can be approximately 0.05 µm to 0.10 µm thick; approximately 0.10 µm to 0.15 µm thick; or more than 0.15 µm thick. In some aspects, adhesion layer 42 can comprise a Ti adhesion layer that can be sputtered over portions of submount 12 prior to deposition of conductive layer 44.

In some aspects, conductive layer 44 can comprise a layer of conductive material, such as Cu, provided over portions of submount 12 and/or over adhesion layer 42, where an adhesion layer is present. In some aspects, conductive layer 44 can comprise material deposited via an electroless process, an electrolytic process, an electroplating process, and/or any other suitable technique. Electroless processes can be used for coating nonmetallic parts and can be similar to an electroplating process except that no outside current may be needed. The metal ions can be reduced by chemical agents in the plating solutions and deposited over portions of submount 12. Electroless plating or processing may be advantageous as a more uniform thickness of the metal layer can be obtained.

In some aspects, conductive layer 44 can be deposited directly over portions submount 12, as adhesion layer 42 is optional. In some aspects, submount 12 can be masked with photoresist and conductive layer 44 can then be sputtered over submount thereby forming one or more areas of conductive material such as conductive traces. Any suitable electrically conductive material can be used to provide conductive layer 44.

In some aspects, conductive layer 44 can comprise a layer of Cu that can for example be approximately 50 µm thick or less, for example, conductive layer 44 can be approximately 50 µm thick, approximately 45 µm thick, approximately 40 µm thick, approximately 35 µm thick, approximately 30 µm thick, approximately 25 µm thick, approximately 20 µm thick, approximately 15 µm thick, approximately 10 µm thick, or less than 10 µm thick. As noted above, conductive layer 44 is not limited to Cu, but can comprise any suitable electrically conducting material of any suitable thickness. In some aspects, conductive layer 44 can comprise any suitable electrically conductive metal or metal alloy.

As FIGS. 3A and 3B illustrate, at least one gap G can be disposed between portions of adjacent traces; for example, between first and second adjacent traces 22A and 22B. In some aspects, gap G can physically and electrically separate first and second adjacent traces 22A and 22B, respectively. Gap G can be formed using any suitable technique. In one aspect, gap G can be at least partially etched after deposition or application of conductive layer 44. That is, first and second adjacent traces 22A and 22B can initially comprise a uniform area or layer of conductive material comprised of one or more layers of metallic material. The layers of metallic material can subsequently become at least partially etched, thereby separating first and second adjacent traces 22A and 22B via provision of gap G. In further aspects, gap G can comprise an area of package 10 that was masked with photoresist prior to sputtering or plating conductive layer 44 over submount 12 to provide traces.

Notably, a reflective material can be positioned, deposited, or otherwise applied within portions of gap G prior to filling gap G with a reflective polymeric material, such as a solder mask SM. Once solder mask SM (e.g., a reflective polymeric material) is applied, in some aspects the reflective material can be at least partially or totally covered, or at least partially buried, by the solder mask. For example, in some aspects a reflective layer 46 can be deposited over portions of exposed adhesive and conductive layers 42 and 44, respectively, as illustrated in FIG. 3A to improve the reflectivity of light from such layers. In some aspects, reflective layer 46 can be deposited directly over portions of submount 12 prior to application of SM as illustrated in FIG. 3B. Notably, however, reflective layer 46 applied over portions of submount 12 prior to application of solder mask SM can be electrically isolated from and/or physically separated from reflective layers 46 applied over traces (e.g., over conductive layers 42 and 44). That is, in some aspects and as FIG. 3B illustrates, portions of submount 12 can remain uncoated such that reflective layer 46 in gap G is physically separated from (and therefore electrically isolated from) reflective layer 46 over conductive layers 42 and 44. This can prevent shorting of the device. In some aspects, reflective layer 46 can comprise a layer of Ag that can be deposited, or otherwise formed, directly over the exposed Cu and/or Ti layers such that the Cu layer is disposed between the Ti and Ag layers. In some aspects, reflective layer 46 can comprise Ag that is deposited via an electroless process (e.g., electroless Ag). In some aspects, reflective layer 46 can for example be approximately 0.1 to 1 μm thick, and/or any sub-range therebetween, such as approximately 0.1 to 0.2 μm thick, approximately 0.2 to 0.5 μm thick, approximately 0.5 to 0.8 thick, and/or approximately 0.8 to 1 μm thick. In some aspects, solder mask SM can be disposed in a gap between first and second side walls, and between first and second reflective layers 46 disposed over the side walls.

In some aspects, and as illustrated in FIG. 3A, portions of package 10 can comprise a three-material system along one direction, generally designated D1. For example, in some aspects, portion of package 10 can comprise a sandwich structure with at least three different materials in areas designated I, II, and III. In some aspects, the three-material system along direction D1 can include a solder mask SM component in area I, a reflective component, such as Ag in area II, and a conducive component such as Cu in area M. In some aspects, solder mask SM material in area I can be directly adjacent reflective material or layer 46 in area II. Similarly, and in some aspects, reflective material in area II can be directly adjacent conductive material or conductive layer 44 in area III. For example, reflective layer 46 can be applied over portions of outermost and opposing side walls of adjacent individual traces 22A and 22B. In some aspects, reflective material or reflective layer 46 can be disposed between portions of solder mask SM and portions of conductive material or conductive layer 44. In some aspects reflective material can be applied to or deposited over portions of gap G and/or traces 22A and 22B prior to application of solder mask SM. Notably, reflective layer 46 can reflect light that may enter portions of gap G, and thereby reduce or eliminate the amount of light that becomes trapped and/or absorbed by portions of gap G.

In some aspects, and as illustrated in FIG. 3B, reflective layer 46 can be deposited below portions of solder mask SM, for example, over a floor of gap G. That is, in some aspects, reflective layer 46 can be disposed over portions of submount 12 that may be disposed between side walls of adjacent individual traces 22A and 22B. Reflective layer 46 can also be deposited over portions of traces 22A and 22B. As illustrated in FIG. 3B, portions of package 10 can include a three-material system along one direction, generally designated D2. For example, in some aspects, portion of package 10 can include a sandwich structure including at least three different materials in areas designated I, II, and III. In some aspects, the three-material system along direction D2 can comprise a solder mask SM component in area I, a reflective component, such as Ag in area II, and a ceramic component, such as submount 12 comprised of AlN or $Al_2O_3$ in area III. Any three-material sandwich structure disposed along direction D2 can be provided, including at least one ceramic material, at least one solder mask material, and at least one reflective material directly disposed therebetween. Reflective layer 46 can advantageously scatter and/or reflect light that may enter portions of gap G and/or solder mask SM (see e.g., FIG. 6), thereby improving light extraction and brightness per package.

Referring to FIGS. 3A and 3B, solder mask SM can for example comprise a white or silver-white liquid curable solder mask material. Solder mask SM can be applied within portions of gap G thereby reducing the amount of light that becomes trapped and/or absorbed by gap 20. This can further improve the brightness and/or overall optical performance of emitter package 10. In one aspect, solder mask SM can be applied only within gap G and not over portions of traces (e.g., 22A and 22B), such that the amount of solder mask material used per package can be reduced, which can advantageously lower the cost associated with light emitter package 10. In some aspects, solder mask SM can be disposed only within gap G, such that traces, including first and second traces 14 and 16, comprise areas of exposed metal disposed directly below and/or outside portions of a lens (e.g. 80, FIG. 5). This novel solder mask placement, when combined with the exposed metal traces, and reflective layers disposed therebetween, can improve reflection, light emission, brightness, and overall performance of light emitter package 10. Portions of solder mask SM and/or traces including first and second trace 14 and 16, respectively, and/or any of the plurality of traces 20 can optionally be covered or layered with an optical conversion material, such as at least one phosphor, lumiphor, and/or more than one phosphoric or lumiphoric material.

Referring in general to FIGS. 3A and 3B, packages 10 and 40, respectively, can each include more than one reflective layer disposed over a light blocking structure or surface. For example and in some aspects, packages 10 and 40 can comprise a first reflective layer covered with a second reflective layer. More than two reflective layers can also be provided. In some aspects, the first reflective layer can comprise a metallic coating, or any other suitable material, such as previously described reflective layer 46. In some aspects, the first reflective layer can be specularly reflective. In some aspects, the second reflective layer can comprise a comprise a white material or white layer, a silver material or silver layer, a reflective plastic material or layer, a Lambertian coating, a diffusively reflective coating, or any other reflective coating adapted to cover the first reflective layer. That is, in some aspects, the second reflective layer can comprise any material adapted to cover a metallic surface, such as reflective layer 46. In some aspects, the second reflective layer can include solder mask SM.

In some aspects, the first and second reflective layers (e.g., such as reflective layer 46 and reflective solder mask SM) can be disposed over a non-reflective light blocking structure, structure, or coating, for example, such as conductive layer 42. The light-blocking structure can comprise any non-reflective material or structure. In some aspects, the light blocking structure comprises a conductive material or conductive layer 42, such as a layer of Cu as previously described.

In some aspects, such as in FIG. 3B, light emitter package 40 can include three adjacent reflective layers. For example, a first reflective layer can comprise Ag deposited along a first side wall (e.g., over first trace 96A). A second reflective layer can comprise Ag deposited along a second side wall e.g., over second trace 96B). A third reflective layer can include a layer of solder mask SM disposed between and directly adjacent first and second reflective layers.

In some aspects and as further described with respect to FIG. 6 below, some of the light emitted by the light emitter chip can penetrate through a portion of the second reflective layer, such as solder mask SM, and can be further reflected from the underlying first reflective layer 46. Some of the light can be directly reflected by portions of solder mask SM. In some aspects, the light blocking surface such as Cu or conductive layer 42 can be covered with a reflective layer 46, and another reflective coating can be disposed over the reflective layer, such as solder mask SM. Solder mask SM can be applied for improving light reflection.

Figure 4:
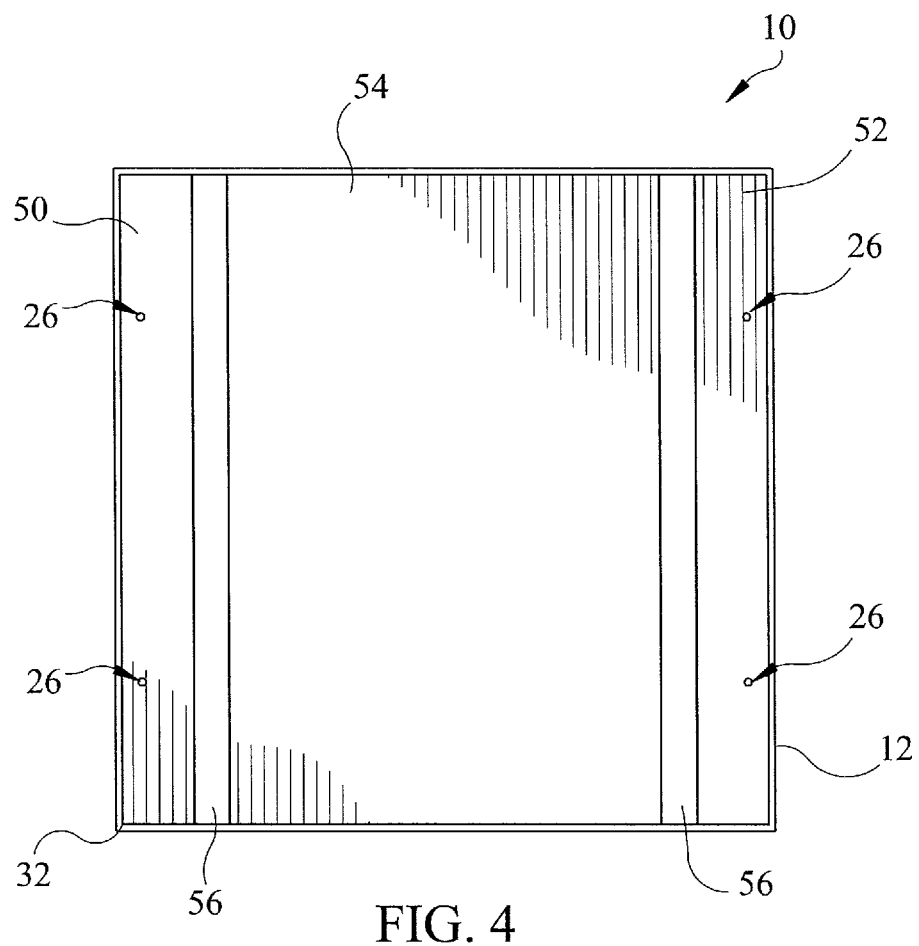
FIG. 4 is a bottom plan view of a of light emitter package according to the disclosure herein.

FIG. 4 illustrates a bottom view of package 10. Package 10 can comprise first and second electrical contacts 50 and 52 adapted to pass electrical signal or current into first and second traces 14 and 16, respectively, causing illumination of light emitters within package 10. First and second electrical contacts 50 and 52 can comprise metallized areas for receiving electrical signal from an external source (not shown), for example, an electrical circuit, a PCB, a metal core printed circuit board (MCPCB), a circuit of a lighting system, a flex circuit, a heat sink, combinations thereof, and/or any other source adapted to transfer electrical current. First and second electrical contacts 50 and 52 can comprise at least one layer of Cu, and optional layers of Ti and/or Ag. The at least one layer of Cu can comprise a thickness ranging for example from approximately 25 µm to approximately 100 µm, and/or any sub-range therebetween, such as approximately 25 to 35 µm; 35 to 45 µm; approximately 45 to 65 µm; approximately 65 to 85 µm; and/or approximately 85 to 100 µm. In one aspect, the Cu layer can comprise an overall average thickness of approximately 35 µm. Where used, the optional Ti layer of contacts 50 and 52 can be disposed between submount 12 and Cu layer and can comprise a thickness ranging from approximately 0.01 to 1 µm, and/or any sub-range or thickness therebetween, such as approximately 0.01 to 0.05 µm; 0.05 to 0.1 µm; and/or 0.1 to 1 µm. In one aspect, the Ti layer can comprise a thickness or overall thickness of approximately 0.1 µm.

In some aspects, first and second contacts 50 and 52, respectively, can further comprise an optional layer of Ag that can be deposited, or otherwise formed, directly over the Cu layer such that the Cu layer is disposed between the Ti and Ag layers. Where used, the Ag layer can comprise a thickness for example from approximately 0.1 to 1 µm, and/or any sub-range therebetween, such as approximately 0.1 to 0.2 µm, 0.2 to 0.5 µm, 0.5 to 0.8, and/or 0.8 to 1 µm. In some aspects, first and second contacts 50 and 52 can comprise electroless Cu and electroless Ag.

First and second electrical contacts 50 and 52 can be disposed over a surface of submount 12 that is opposite the placement of first and second traces 14 and 16 and/or the plurality of traces 20. For example, first and second electrical contacts 50 and 52 can be disposed on a bottom surface of submount 12 and first and second electrical traces 14 and 16 can be disposed on the top surface of submount 12. Electrically conductive vias 26 can electrically connect first and second electrical contacts 50 and 52 to first and second traces 14 and 16, respectively. Electrical current can then pass between first and second contacts 50 and 52 to first and second traces 14 and 16, respectively, for illumination of light emitters (FIG. 5) when electrical energy is converted into light.

A current or electrical signal can be applied through first and second electrical contacts 50 and 52 from an external source (not shown) when package 10 mounts over an external source. For example, first and second electrical contacts 50 and 52 can electrically communicate to solder contacts or other conductive paths located on the external source (not shown), and pass current into first and second traces 14 and 16, respectively. An external source can comprise any suitable external source capable of conveying or passing electrical current into package 10. In the embodiment shown, light emitter package 10 can be arranged for mounting using surface mount technology. In some aspects, first and second electrical contacts 50 and 52 can at least partially align with first and second electrical traces 14 and 16, respectfully.

In some aspects and according to FIG. 4, light emitter package 10 can further comprise a thermal element 54 disposed over the bottom surface of submount 12. Thermal element 54 can optionally be disposed between first and second electrical contacts 50 and 52, respectively. In one aspect, thermal element 54 can be substantially centrally disposed over submount 12 and below the one or more light emitters (e.g., LED chips 74, FIG. 5). Thermal element 54 can comprise any thermally conductive material and can be in at least partial vertical alignment with light emitters. In one embodiment, thermal element 54 can be electrically separated from electrical traces 14 and 16 on top surface of submount 12 as well as from first and second contacts 50 and 52. Thermal element 54 can be adapted to dissipate heat associated with light emitters in some aspects by allowing heat to spread into thermal element 54 where it can dissipate more readily from the package 10.

For packages or device used in surface mount technology, the thickness of thermal element 54 and first and second electrical contacts 50 and 52 can be approximately the same such that all three components can make contact to a lateral surface, such as a PCB. To improve wetting of the solder however, and to ensure a more robust contact between thermal element 54 and an external heat sink, thermal element 54 may extend away from the body of the package 10 to a greater distance than first and second electrical contacts 50 and 52. That is, it is contemplated that thermal element 54 can, but does not have to, be thicker than first and second electrical contacts 50 and 52.

In some aspects, and as illustrated in FIG. 4, areas or portions of electrically and/or thermally insulating material, such as areas of solder mask material 56, can be provided between thermal element 54 and each of first and second electrical contacts 50 and 52. In one aspect, solder mask 54 can comprise a green color, and can for example be approximately 1 to 25 µm thick, and any sub range thereof, such as approximately 1 to 5 µm, approximately 5 to 10 µm, approximately 10 to 13 µm, approximately 13 to 15 µm, approximately 15 to 20 µm, and/or approximately 20 to 25 µm.

In some aspects and according to FIG. 5, a light emitter package, generally designated 60 can further comprise an optical element. Light emitter package 60 can be similar in form and function to package 10, but can include an optional optical element. Light emitters, such as LED chips 74 are also illustrated in package 60. For illustration purposes, three LED chips 74 are schematically illustrated as rectangles having straight cut sides, however, as noted earlier, multiple chips of any size and/or shape of light emitter can be provided. LED chips 74 can also be wirebonded to portions of traces, and light emitters having beveled sides can also be provided.

Light emitter package 60 can comprise a submount 62. In some aspects, submount 62 can comprise a ceramic based material such as AlN or $Al_2O_3$. First and second electrical traces 66 and 68, respectively, can be deposited over a top surface 64 of submount 62. First and second traces 66 and 68 can be peripherally disposed about a plurality of traces 70. The plurality of traces 70 can comprise multiple individual traces 72 adapted to support and electrically communicate with multiple LED chips 74. A plurality of gaps G can be disposed or provided between first trace 66 and second trace 68, and between individual traces 72 within the plurality of traces 70. Notably, in some aspects a reflective material can be applied over portions of traces (e.g., side walls between and/or adjacent gaps G) and/or over a floor of gaps G prior to application of a solder mask material within gaps G. The reflective material can increase an amount of light reflected from gap areas, and improve optical properties, such as brightness and light extraction per package 60.

In some aspects, first and second electrical traces 66 and 68 can comprise an anode and cathode pair configured to pass electrical current or signal into LED chips 74. For example, electrical current can be conducted through and/or within submount 62 from an outside electrical power source (not shown) into one or more bottom electrical contacts (e.g., 50, 52, FIG. 4) and into respective traces 66 and 68 by electrically conductive "through-holes" or "vias" generally designated 76. In some aspects, vias 76 can provide a conduit for electrical current within light emitter package 60. The electrical current can then flow or pass between first and second traces 66 and 68 and into LED chips 74 thereby causing illumination of the plurality of LED chips 74. Electrical current can then exit light emitter package via at least one bottom electrical contact. In one aspect, first electrical trace 66 can comprise an anode as denoted by the "+" shaped indicator symbol or sign disposed over at least one connection point 78. In some aspects, second electrical trace 68 can comprise a cathode.

The size of submount 62 and/or light emitter package 60 can vary depending upon, for example, the size and/or number of LED chips 74. For illustration purposes, three LED chips 74 are shown, however, four or more LED chips 74, a plurality of LED chips 74, and/or an array of LED chips 74 is also contemplated herein. In some aspects, more than five LED chips 74 can be provided per package, in other aspects, more than 20 LED chips 74 can be provided per package, in other aspects, more than 30 LED chips 74 can be provided per package, in other aspects, more than 40 LED chips 74 can be provided per package, in other aspects, more than 50 LED chips 74 can be provided. In some aspects, package 60 can comprise 96 LED chips 74. LED chips 74 can comprise the same and/or different colors and/or targeted wavelength range, including for example, being configured to emit light that is red, blue, cyan, green, amber, red-orange, yellow, white, and/or combinations thereof. For example, where multiple LED chips 74 are used, the LED chips 74 can comprise similar and/or different targeted wavelength bins including red, blue, cyan, green, amber, red-orange, and/or combinations thereof.

LED chips 74 can comprise any suitable dimension, size, and/or shape. For example, square and/or rectangle LED chips 74 having straight cut and/or bevel cut sides are contemplated herein. In one aspect, LED chips 74 can comprise a chip having a length and/or width that is approximately 0.1 mm (e.g., 100 μm) or more, for example, LED chips 74 can comprise a length and/or width of 0.1 to 0.5 mm; approximately 0.5 to 0.75 mm; approximately 0.75 to 0.85 mm; approximately 0.85 to 0.95 mm; or approximately 1 mm or more. Any size and/or shape of LED chips 74 are contemplated herein.

In some aspects, submount 62 can comprise a thickness between approximately 0.25 and 1.25 millimeters (mm) as measured between uppermost and bottommost surfaces of submount 62. For example, submount 62 can comprise a thickness of approximately 0.25 to 0.5 mm; approximately 0.5 mm; approximately 0.5 to 0.75 mm; and/or approximately 0.75 to 1.25 mm. Submount 62 can comprise any suitable shape, for example, such as a square, rectangle, circular, non-circular, regular, irregular, and/or asymmetrical shape. In one aspect, submount 62 can comprise a substantially square shape having a length and a width of approximately 2 mm or more. For example and without limitation, submount 62 can comprise a substantially square shape of the following length and width dimensions, respectively: approximately 3.0 mm×3.0 mm (e.g., an area of approximately 9 $mm^2$); approximately 3.45 mm×3.45 mm (e.g., an area of approximately 11.9 $mm^2$); approximately 4.0 mm×4.0 mm (e.g., an area of approximately 16 $mm^2$); approximately 5 mm×5 mm (e.g., an area of approximately 25 $mm^2$); approximately 6 mm×6 mm (e.g., an area of approximately 36 $mm^2$); approximately 7×7 mm (e.g., an area of approximately 49 $mm^2$); approximately 8×8 mm (e.g., an area of approximately 64 $mm^2$); approximately 9×9 mm (e.g., an area of approximately 81 $mm^2$); approximately 9.1×9.1 mm (e.g., an area of approximately 82.8 $mm^2$); and/or approximately 10 mm×10 mm (e.g., an area of approximately 100 $mm^2$); and/or length(s) and/or width(s) of more than approximately 10 mm×10 mm. In one aspect, a submount 62 comprising an area equal to and/or greater than approximately 45 $mm^2$ can be used.

In some aspects as illustrated in FIG. 5, light emitter package 60 can further comprise an optical element. An optical element can comprise any member or material configured to produce light output of a desired shape and/or position light in a desired direction, and can comprise a layer of encapsulant and/or a lens 80. Lens 80 can comprise a protective layer 82 and a substantially concave or convex lens portion 84. In some aspects, lens portion 84 can comprise a substantially hemisphere shaped portion having a substantially circular lens base 86, however, any shape of lens portion 84 and/or lens base 86 can be provided.

Protective layer 82 can extend from portions of lens 80, for example, outwardly from portions of a lens base 86, and can be configured to extend over submount 62, and up to outermost edges of submount 62. At least a portion of lens 80 can be disposed over portions of first and second traces 66 and 68, respectively, and the plurality of traces 70, each of which can comprise areas of exposed metal. Optical element or lens 80 can be formed on a top surface of submount 64 and can be centrally disposed or centrally aligned over a center of the plurality of traces 70 and/or a center of submount 62, such that an apex, or area of maximum height, is aligned over the center of the plurality of traces 70 and/or over the center of submount 62. In other aspects, lens 80 can be non-centrally disposed (e.g., off-center) with respect to a center of the plurality of traces 70 and/or a center of submount 62. Lens 80 can provide both environmental and/or mechanical protection of package components, such as LED chips 74, wirebonds (not shown), and/or exposed metal traces, such as first and second traces 66 and 68, and the plurality of traces 70.

In some aspects, lens 80 can comprise any material, such as an epoxy, plastic, glass, and/or silicone material, and can be provided using any method, such as encapsulating or molding. Lens 80 can for example comprise an overmolded lens and can comprise any suitable shape depending on the desired shape of the light output. One suitable shape as shown is hemispheric, where lens 80 comprises a substantially circular lens base 86. A lens having a non-hemispheric or circular cross-sectional and/or base shape is also contemplated herein, such as an ellipsoid bullet shaped lens, flat lens, hex-shaped lens and/or lens base, and/or square shaped lens and/or lens base. In one aspect, lens 80 can comprise a silicone material that is suitable for molding and can provide suitable optical transmission properties. It can also withstand subsequent reflow processes and does not significantly degrade over time. It is understood that lens 80 can also at least partially be textured to improve light extraction and/or be coated with or contain optical conversion, light scattering, and/or reflective materials such as phosphors or light scattering particles.

In some aspects, and as noted above, protective layer 82 can substantially cover the top surface of submount 62 and extend between edges of lens base 86 and one or more edges of submount 62. Protective layer 82 can provide additional protection for components of light emitter package 60, such as LED chips 74, exposed metal traces, solder mask disposed in gaps G and/or wirebonds. Protective layer 82 can further reduce damage and/or contamination such as grease or debris during subsequent processing steps and use. For example, protective layer 82 can protect traces and/or optical conversion material from peeling and/or lifting during processing. Protective layer 82 can be formed during formation of lens 80 and can comprise the same and/or a different material as lens 80. It is understood, however, that package 60 can also be provided without protective layer 82. It is understood that the lens arrangement of light emitter package 60 can easily be adapted for use with a secondary lens or optics that can be included over lens 80 by the end user to facilitate beam shaping. These secondary lenses are generally known in the art, with many of them being commercially available.

In some aspects, an optical conversion material (not shown) can be provided over portions of lens 80, traces, and/or LED chips 74 to produce a desired color of light output from package 60. Optical conversion material can comprise one or more binders, phosphors, lumiphors, or a phosphor or lumiphor containing material and/or binder applied via any suitable technique. In one aspect, the optical conversion material can absorb at least some of the light emitted from any one of the multiple LED chips 74 and can in turn emit light having a different wavelength such that light emitter package 60 emits a combination of light from one or more LED chips 74 and a phosphor. In one aspect, light emitter package 60 can emit light that is perceived as white light of approximately 2700 to 7000K, such as cool white (CW) light around 6000K or warm white (WW) light around 3000K. In one aspect, one or more LED chips 74 selected for use can comprise wavelengths targeting CW or WW light upon, for example, mixing with light emitted from the phosphors or a phosphor containing material. Any suitable wavelength bin and/or phosphor combination can be selected depending upon the application and desired light emission. Phosphors can be adapted to emit light that is yellow, green, red, and/or combinations thereof upon absorbing light emitted by one or more LED chips 74.

In some aspects, one or more electrostatic discharge (ESD) protection devices (not shown) can optionally be provided within package 60 and can be electrically connected to first and second traces 66 and 68 and reverse biased with respect to LED chips 74. Where used, ESD devices can protect LED chips 74 from damage associated with ESD within package 60. For example, the arrangement of LED chips 74 and ESD device(s) can allow excessive voltage and/or current passing through package 60 from an ESD event to pass into and/or through ESD device(s) instead of LED chips 74, thereby protecting LED chips 74 from damage. ESD devices can comprise any suitable device, for example, a (vertical or horizontally structured) silicon (Si) Zener diode, a differently dimensioned and/or smaller LED chip arranged reverse biased to LED chips 74, a surface mount varistor, and/or a lateral Si diode.

Figure 6:
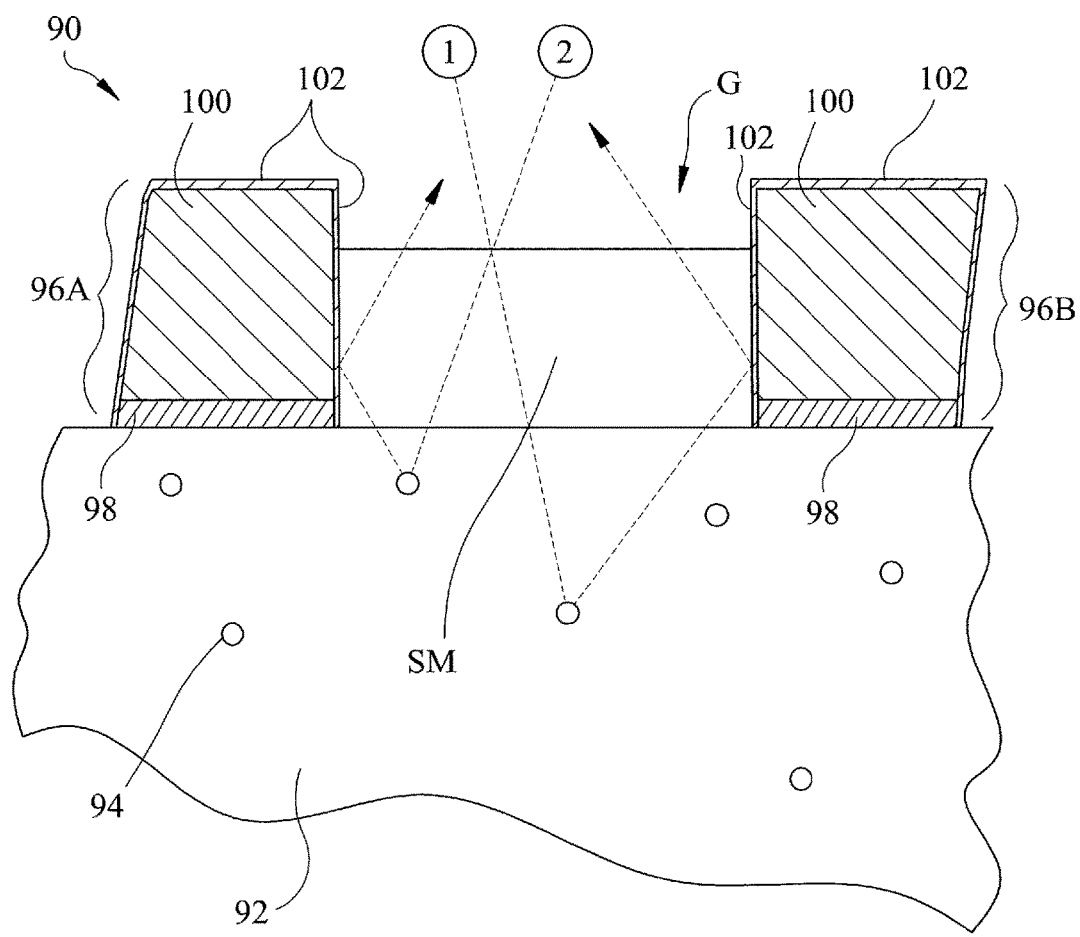
FIG. 6 is a sectional view of a light emitter package according to one aspect of the disclosure herein.

In some aspects, as FIG. 6 schematically illustrates, total reflection and light extraction capabilities can be improved from a light emitter package, generally designated 90, as light that enters a gap G disposed between adjacent traces can be reflected back out therefrom. For example, light emitter package 90 can comprise a submount 92 over which a first trace 96A and a second trace 96B can be deposited. First and second traces 96A and 96B can comprise a reflective layer 102, a conductive layer 100, and an optional adhesion layer 98. In some aspects, reflective layer 102 can comprise any reflective material, such as Ag. In some aspects, conductive layer 100 can include any conductive material, such as Cu. In some aspects, adhesion layer 100 can include any material adapted to improve adhesion between traces and submount 92, including Ti. Thicknesses of such layers were illustrated and described in FIGS. 3A and 3B. In some aspects, reflective layer 102 can also be disposed over a floor of gap G (e.g., FIG. 3B).

Submount 92 can comprise a ceramic material or a ceramic based submount, which may be desirable for use in light emitter packages described herein for improved thermal management properties. In addition, ceramic based submounts 92 can comprise light scattering areas 94 adapted to internally reflect or scatter light received from light emitter chips (74, FIG. 5). Light can therefore enter into a portion of submount 92, and can scatter and/or reflect from scattering areas 94 and be emitted back out from the submount 92. Providing reflective layer 102 over portions of conductive layer 100 can allow the scattered light to be reflected from portions of the gap G, rather than be blocked, trapped, or absorbed by gap G. For example, conductive layer 100, which can comprise Cu, may be dark and/or a poor reflector. As such, providing a reflective layer 102 over portions of conductive layer 100 can increase reflection of light from gap G, as light that enters into portions of a reflective polymeric material (e.g., a solder mask SM) and gap G can be reflected out therefrom. Notably, reflective layer 102 can be applied to trace side walls and/or a floor of gap G (e.g., FIG. 3B) prior to application of solder mask SM.

Light scattering areas 94 can comprise one or more areas of optical material such as light scattering particles (e.g., particles of $Al_2O_3$, $TiO_2$, $BaSO_4$, and/or AlN), areas comprising grain boundaries disposed between ceramic filler material, areas comprising porosity, and/or any other suitable area that can reflect and/or scatter light. Submount 92, therefore, can receive light emitted by at least one LED chip (74, FIG. 5) and re-emit that light from surfaces of submount 92 as indicated by the arrows along paths 1 and 2. Rather than becoming trapped within gap G and/or absorbed by dark conductive material, the light can continue along paths 1 and 2 and become reflected from portions of reflective layer 102 and exit gap G. This can advantageously improve brightness and light extraction from package 90. For illustration purposes, internal scattering or reflecting areas 94 are schematically illustrated and visible, however, such areas may not be visible to the naked eye and can comprise transparent areas within submount 92.

Figure 7A:
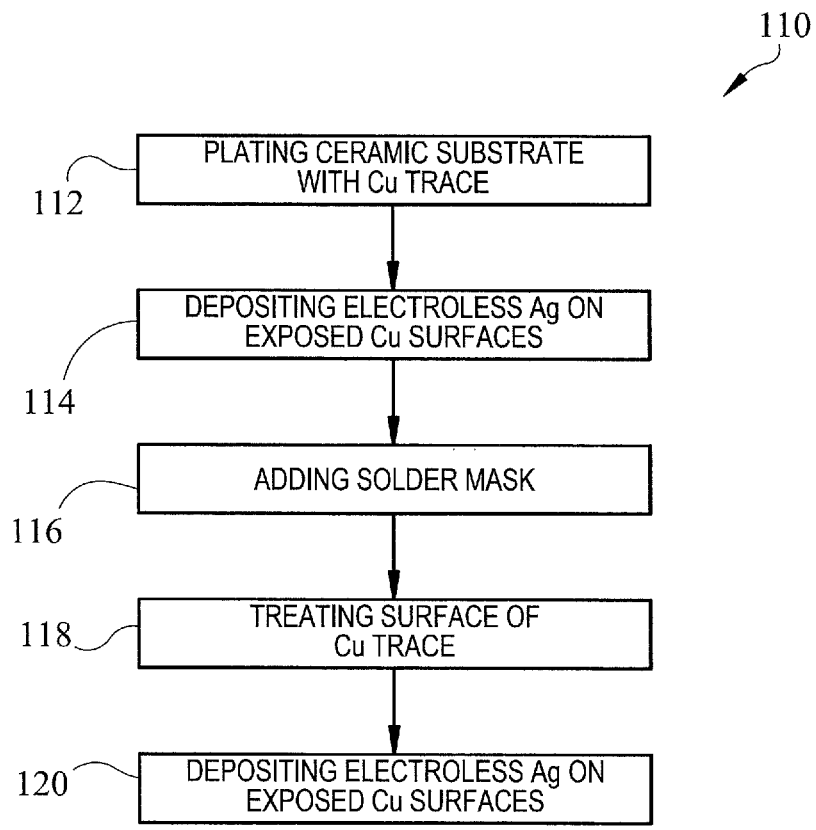
FIGS. 7A and 7B are flow charts of exemplary steps according to a method of providing a light emitter package according to the disclosure herein.
Figure 7B:
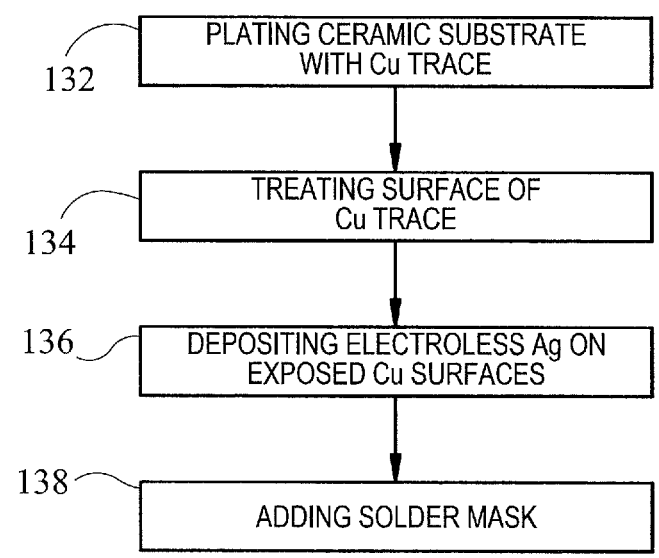

FIGS. 7A and 7B are flow charts illustrating, for example and without limitation to the steps or sequences thereof, methods that can be used for providing light emitter package according to the disclosure herein. Notably, methods described herein can comprise application and/or treating portions of the submount and/or portions of the traces adjacent a gap to be reflective, for example, by depositing a reflective layer over such surfaces prior to application of solder mask material within the gap as previously described.

Referring to FIG. 7A and in some aspects, a reflective material or a reflective layer can be deposited or applied in a process generally designated 110, including more than one step over more than one surface. For example and initially, a ceramic substrate or submount can be provided for use in a light emitter package. According to step 112, the ceramic substrate or submount can be plated with a conductive material, such as an exposed metal conductive Cu trace. The Cu trace can comprise side walls and an upper surface disposed therebetween. According to step 114, a reflective material or layer, such as an electroless Ag, can be deposited over exposed portions of the Cu trace surfaces, such as over side walls. In some aspects, the side walls of a conductive trace can be initially deposited with electroless Ag. According to step 116, a solder mask can be subsequently be added over the substrate and/or directly adjacent to and over portions of the electroless Ag coated Cu trace side walls. In some aspects, solder mask can be added and applied to gaps, and the electroless Ag coated Cu can comprise side walls of electrical traces. In some aspects, the solder mask can be applied using any suitable process, including using a dry film technique or a dispensing process.

According to step 118, another surface of the Cu trace can be treated (e.g., burnished, polished, etc. for die attach). In some aspects, the other surface of the Cu trace can comprise an upper surface that is substantially orthogonal to the Cu trace side walls. That is, the other surface of Cu to be treated after addition of the solder mask can include the portion of trace to which an LED chip will be die attached and/or wirebonded to. According to step 120, a layer of electroless Ag reflective material can be applied to the exposed and treated Cu surface. Thus, according to FIG. 7A, reflective layer can be deposited in more than one step. In some aspects, the reflective layer can be applied to side walls of a trace prior to application of a solder mask material. Upper surfaces of the trace can be subsequently treated and plated with a reflective material, such as an electroless Ag.

Referring to FIG. 7B and in some aspects, a reflective material or a reflective layer can be deposited or applied according to a process generally designated 130, where the reflective material can be applied in a single step over more than one surface of a Cu trace and prior to application of a solder mask. For example and initially, a ceramic substrate or submount can be provided for use in a light emitter package. According to step 132, the ceramic substrate can be plated with a Cu trace. According to step 134, surfaces of the Cu trace can be treated for die attachment, such as burnishing and/or polishing the surface of the Cu trace. According to step 136, a reflective material including electroless Ag can be deposited on the exposed Cu surface. According to step 138, solder mask can be added over portions of the plated Cu surface. The solder mask can comprise a controlled solder mask addition via a dry film application technique or dispensing.

As described above, novel plating, solder mask placement, and/or other features or components can be used alone and/or in combination to provide packages and systems having improved optical performance at a lower cost. For example, plating side walls associated with gaps between traces with a reflective material can improve reflectivity from submount and can improve light extraction without requiring more LED chips and/or more power to be used. Embodiments as disclosed herein may provide one or more of the following beneficial technical effects: improved brightness from package; improved light extraction per package; improved package reflection; reduced cost of light emitter packages or products; reduced size or number of light emitter chips; improved dissipation of heat (and concomitant improvement of operating life) packages; and/or improved manufacturability of light emitter packages.

While the subject matter herein has been has been described in reference to specific aspects, features, and/or illustrative embodiments, it will be appreciated that the utility of the described subject matter is not thus limited, but rather extends to and encompasses numerous other variations, modifications and alternative embodiments, as will suggest themselves to those of ordinary skill in the field of the present invention, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

Whit is claimed is:

1. A light emitter package comprising: a substrate for supporting at least one light emitter chip; a first electrically conductive layer and a second electrically conductive layer on the substrate, comprising a gap between the first and second electrically conductive layers, wherein each of the first and second electrically conductive layers has a side wall; a reflective stack of materials comprising: a reflective layer; and a reflective polymeric material disposed on the reflective layer, wherein the reflective polymeric material is thicker than the underlying reflective layer and is disposed in and substantially extends across a width of the gap; and wherein the reflective stack of materials comprising the reflective layer and reflective polymeric material is disposed over the side walls of the first and second electrically conductive layers, wherein the side walls of the first and second electrically conductive layers having the reflective stack of materials disposed thereon are substantially orthogonal with respect to the substrate.

2. The light emitter package of claim 1, wherein the reflective polymeric material is white.

3. The light emitter package of claim 1, wherein the substrate comprises a ceramic based material.

4. The light emitter package of claim 3, wherein the substrate comprises aluminum nitride (AlN).

5. The light emitter package of claim 3, wherein the substrate comprises alumina ($Al_2O_3$).

6. The light emitter package of claim 1, wherein the reflective layer comprises a layer of silver (Ag).

7. The light emitter package of claim 6, wherein the Ag is electroless plated.

8. The light emitter package of claim 6, wherein the Ag is between 0.2 µm and 0.5 µm thick.

9. The light emitter package of claim 1, wherein the first and second electrically conductive layers comprise copper (Cu).

10. The light emitter package of claim 9, wherein the Cu is electroplated.

11. The light emitter package of claim 9, wherein the Cu is between 20 and 70 µm thick.

12. The light emitter package of claim 1, further comprising at least one light emitting diode (LED) chip.

13. The light emitter package of claim 1, further comprising multiple light emitting diode (LED) chips.

14. The light emitter package of claim 1, wherein the reflective polymeric material, the reflective layer, and the substrate are disposed adjacent each other within a portion of the light emitter package, and wherein the substrate comprises a ceramic based material.

15. A light emitter package comprising:
a substrate comprising a substrate surface;
a first trace disposed over the substrate surface;
a second trace disposed over the substrate surface;
a gap disposed between the first and second traces;
a plurality of traces centrally disposed between the first and second traces; and
at least one light emitter chip disposed over the substrate surface, the chip being adapted to electrically communicate with portions of the first and second traces;
wherein first and second side walls of the first and second traces, respectively, are orthogonally disposed with respect to the substrate surface and oppose each other across the gap, and wherein the first and second side walls are coated with a reflective plastic material and a metallic material, wherein the reflective plastic material is disposed directly adjacent to the first and second side walls, within the gap, wherein the reflective plastic material is disposed in and extends substantially across a width of the gap.

16. The light emitter package of claim 15, further comprising more than five light emitter chips.

17. The light emitter package of claim 15, further comprising more than 20 light emitter chips.

18. The light emitter package of claim 15, further comprising 96 light emitter chips.

19. The light emitter package of claim 15, further comprising a plurality of gaps provided between individual traces of the plurality of traces.

20. The light emitter package of claim 19, wherein each gap of the plurality of gaps is disposed between adjacent side walls of adjacent traces of the plurality of traces.

21. The light emitter package of claim 20, wherein each of the adjacent side walls comprises a layer of copper and an outermost layer of silver.

22. The light emitter package of claim 19, wherein the reflective plastic material is provided within a portion of each gap of the plurality of gaps.

23. The light emitter package of claim 15, further comprising an optical element.

24. A method of producing a light emitter package, the method comprising: providing a substrate for supporting a light emitter; providing an electrically conductive layer having at least two side walls and a gap therebetween on the substrate; providing a reflective stack of materials comprising: a reflective layer; and a reflective polymeric material disposed over the reflective layer, wherein the reflective polymeric material is thicker than the underlying reflective layer and is disposed in and substantially extends across a width of the gap; and providing the reflective stack of materials comprising the reflective layer and reflective polymeric material over the at least two side walls of the electrically conductive layer, wherein the at least two side walls of the electrically conductive layer having the reflective stack of materials disposed thereon are substantially orthogonal with respect to the substrate.

25. The method of claim 24, wherein the light emitter package comprises a conductive layer, and wherein the reflective stack of materials is disposed over a portion of a floor of a gap.

26. The method of claim 24, further comprising providing one or more light emitter chips over the substrate.

27. The method of claim 24, wherein providing the substrate comprises providing an aluminum nitride (AlN) or ($Al_2O_3$) substrate.

28. The method of claim 24, further comprising side walls of first and second opposing conductive traces and a floor of a gap disposed between the side walls of the first and second opposing conductive traces.

29. The method of claim 28, further comprising burnishing and polishing upper surfaces of the first and second opposing conductive traces.

30. The method of claim 29, further comprising providing a second reflective layer over the burnished and polished upper surfaces of the first and second opposing conductive traces.

31. A light emitter package comprising: a substrate for at least one light emitter chip; a conductive layer on the substrate; a trace disposed over the substrate, the trace comprising at least two side walls and a gap therebetween; a first reflective layer disposed on portions of the substrate, the conductive layer and on a portion of the trace; and a second reflective layer disposed over the first reflective layer and disposed in and substantially extending across a width of the gap; wherein the first reflective layer is disposed over a side wall of the conductive layer; wherein the second reflective layer is a reflective polymeric material that is electrically insulating, thermally insulating, and both light reflective and light permeable to re-reflect permeated light from the light emitter package via the underlying first reflective layer.

32. The light emitter package of claim 31, wherein the light emitter package comprises a light blocking surface, and wherein the first reflective layer is directly disposed over the light blocking surface.

33. The light emitter package of claim 32, wherein the light blocking surface comprises an electrically conductive material.

34. The light emitter package of claim 33, wherein the electrically conductive material comprises copper (Cu).

35. The light emitter package of claim 31, wherein the first reflective layer comprises a metallic coating.

36. The light emitter package of claim 35, wherein the metallic coating comprises silver (Ag).

37. The light emitter package of claim 31, wherein the second reflective layer is white.

38. The light emitter package of claim 31, wherein the second reflective layer comprises plastic.

39. The light emitter package of claim 31, wherein the second reflective layer comprises a Lambertian coating.

40. The light emitter package of claim 31, wherein the first reflective layer is specularly reflective and wherein the second reflective layer is diffusively reflective.

41. The light emitter package of claim 31, wherein the substrate comprises a ceramic based material.

42. The light emitter package of claim 41, wherein the substrate comprises aluminum nitride (AlN).

43. The light emitter package of claim 41, wherein the substrate comprises alumina ($Al_2O_3$).

44. A method of producing a light emitter package, the method comprising: providing a substrate; providing a conductive layer on the substrate; providing a trace over the substrate, the trace comprising at least two side walls and a gap therebetween; providing a first reflective layer on portions of the substrate and on a portion of the trace; and providing a second reflective layer over the first reflective layer and disposed in and substantially extending across a width of the gap; wherein the first reflective layer is disposed over a side wall of the conductive layer; wherein the second reflective layer is a reflective polymeric material that is electrically insulating, thermally insulating, and both light reflective and light permeable to re-reflect permeated light from the light emitter package via the underlying first reflective layer.

45. The method of claim 44, wherein the light emitter package comprises a layer of electrically conductive material, and wherein providing the first reflective layer comprises plating the first reflective layer directly over the layer of electrically conductive material.

46. The method of claim 44, wherein providing the second reflective layer comprises providing a reflective plastic that is disposed over the first reflective layer.

47. The method of claim 44, wherein providing the first reflective layer comprises providing a specularly reflective layer of metal.

48. The method of claim 44, wherein the light emitter package comprises a layer of electrically conductive material, and wherein providing the first reflective layer comprises plating a side wall of the electrically conductive material.

49. The method of claim 44, further comprising providing one or more light emitter chips over the substrate.

* * * * *